(12) United States Patent
Farooq et al.

(10) Patent No.: US 8,022,543 B2
(45) Date of Patent: Sep. 20, 2011

(54) UNDERBUMP METALLURGY FOR ENHANCED ELECTROMIGRATION RESISTANCE

(75) Inventors: Mukta G. Farooq, Hopewell Junction, NY (US); Robert Hannon, Wappingers Falls, NY (US); Emily R. Kinser, Poughkeepsie, NY (US); Ian D. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 12/054,713

(22) Filed: Mar. 25, 2008

(65) Prior Publication Data

US 2009/0243098 A1    Oct. 1, 2009

(51) Int. Cl.
*H01L 23/48* (2006.01)
(52) U.S. Cl. ......... 257/753; 257/734; 257/738; 257/750
(58) Field of Classification Search .............. 257/750, 257/751, 767, 779, 734, 738, 753, E23.021
See application file for complete search history.

(56) References Cited

U.S. PATENT DOCUMENTS

| | | | | |
|---|---|---|---|---|
| 5,471,092 A * | 11/1995 | Chan et al. | .................... | 257/753 |
| 6,037,248 A * | 3/2000 | Ahn | ................ | 438/619 |
| 6,197,613 B1 * | 3/2001 | Kung et al. | .................... | 438/106 |
| 6,500,750 B1 * | 12/2002 | Shroff et al. | .................... | 438/622 |
| 6,539,624 B1 * | 4/2003 | Kung et al. | .................... | 29/843 |
| 6,930,389 B2 | 8/2005 | Huang | | |
| 7,071,564 B1 * | 7/2006 | Erb et al. | ....................... | 257/774 |
| 7,518,241 B2 * | 4/2009 | Tai et al. | ....................... | 257/738 |
| 2005/0032349 A1 * | 2/2005 | Lee et al. | ...................... | 438/614 |
| 2005/0092611 A1 * | 5/2005 | Kim et al. | ...................... | 205/123 |
| 2005/0118437 A1 * | 6/2005 | Cheng et al. | .................. | 428/458 |
| 2005/0258539 A1 * | 11/2005 | Minda | ............................ | 257/738 |
| 2006/0016861 A1 * | 1/2006 | Daubenspeck et al. | .. | 228/180.21 |
| 2006/0027933 A1 * | 2/2006 | Chen et al. | ...................... | 257/772 |
| 2006/0076677 A1 * | 4/2006 | Daubenspeck et al. | ....... | 257/734 |
| 2006/0091536 A1 * | 5/2006 | Huang et al. | ................... | 257/734 |
| 2007/0045848 A1 * | 3/2007 | Tai et al. | ....................... | 257/738 |
| 2007/0222073 A1 * | 9/2007 | Farooq et al. | .................. | 257/738 |
| 2008/0017993 A1 * | 1/2008 | Takewaki et al. | ............. | 257/773 |
| 2008/0026560 A1 * | 1/2008 | Nair et al. | ..................... | 438/614 |
| 2008/0054459 A1 * | 3/2008 | Lee et al. | ...................... | 257/737 |
| 2008/0217384 A1 * | 9/2008 | Jayantha et al. | ......... | 228/180.21 |
| 2009/0140423 A1 * | 6/2009 | Belanger et al. | .............. | 257/738 |

* cited by examiner

*Primary Examiner* — Davienne Monbleau
*Assistant Examiner* — William Harriston
(74) *Attorney, Agent, or Firm* — Scully, Scott, Murphy & Presser, P.C.; Joseph P. Abate, Esq.

(57) ABSTRACT

A first metallic diffusion barrier layer is formed on a last level metal plate exposed in an opening of a passivation layer. Optionally, a metallic adhesion promotion layer is formed on the first metallic diffusion barrier layer. An elemental metal conductive layer is formed on the metallic adhesion promotion layer, which provides a highly conductive structure that distributes current uniformly due to the higher electrical conductivity of the material than the layers above or below. A stack of the second metallic diffusion barrier layer and a wetting promotion layer is formed, on which a C4 ball is bonded. The elemental metal conductive layer distributes the current uniformly within the underbump metallurgy structure, which induces a more uniform current distribution in the C4 ball and enhanced electromigration resistance of the C4 ball.

16 Claims, 6 Drawing Sheets

UNDERBUMP METALLURGY FOR ENHANCED ELECTROMIGRATION RESISTANCE

FIELD OF THE INVENTION

The present invention relates to semiconductor structures, and particularly to underbump metallurgy (UBM) structures including a conductive layer that provides uniform current density through a C4 ball, and methods of forming the same.

BACKGROUND OF THE INVENTION

Once formation of semiconductor devices and interconnects on a semiconductor wafer (substrate) is completed, the semiconductor wafer is diced into semiconductor chips, or "dies." Functional semiconductor chips are then packaged to facilitate mounting on a circuit board. A package is a supporting element for the semiconductor chip that provides mechanical protection and electrical connection to an upper level assembly system such as the circuit board. One typical packaging technology is Controlled Collapse Chip Connection (C4) packaging, which employs C4 balls each of which contacts a C4 pad on the semiconductor chip and another C4 pad on a packaging substrate. The packaging substrate may then be assembled on the circuit board.

Thus, the packaging substrate provides an electrical link between the semiconductor chip and a system board of a computer. A semiconductor chip is mounted on a die foot print area located on a top surface of the packaging substrate. The semiconductor chip contains C4 pads on which an array of C4 balls may be attached by C4 bonding. The C4 balls are subsequently attached to the die foot print area of the packaging substrate.

A typical semiconductor chip employing a packaging substrate may comprise about 5,000 input/output nodes. Each of these nodes are electrically connected to a C4 pad on a top surface of the semiconductor chip in a two dimensional array. Typical two dimensional array configurations for the C4 pads include 4 on 8 configuration, which employs C4 solder balls having a diameter of 4 mils (approximately 100 microns) and a pitch of 8 mils (approximately 200 microns) in a rectangular array, and 3 on 6 configuration, which employs C4 solder balls having a diameter of 3.0 mils (approximately 75 microns) and a pitch of 6 mils (approximately 150 microns) in a rectangular array. Thus, more than 5,000 C4 solder balls may be formed on the semiconductor chip, which may be typically about 2.5 cm×2.5 cm in size.

The collection of metallic layers employed to attach a C4 ball to a semiconductor chip is called an "underbump metallurgy structure," or a "UBM structure" in the art. A typical underbump metallurgy structure includes a stack of a metallic diffusion barrier layer and a wetting promotion layer. The metallic diffusion barrier layer is formed directly on the semiconductor chip and comprises an adhesion promoting metallic material such as Ti, TiW, or TiN. The wetting promotion layer may comprise an elemental metal such as Cu, Ni, Au, or Ag. Alternately, the wetting promotion layer may comprise a Cu—Ni alloy. Usable material for the wetting promotion layer is limited since the wetting promotion layer needs to provide wetting for a C4 ball to be soldered thereupon.

Electromigration resistance of C4 balls is critical in determining limits of operating temperature and electrical current that the C4 balls may be subjected to. The higher the electromigration resistance of the C4 balls, the harder it is for electromigration to occur at a given condition of electrical current and temperature, and the longer the expected lifetime of the module employing the C4 balls within the chip package. The expected lifetime of a module is typically measured in thousands of power on hours (KPOH), and typically translates to at least several years of operation in normal operation mode.

As an increasing number of input and output nodes are employed in a semiconductor module, more C4 balls are employed in the semiconductor module, which requires use of a high density array of C4 balls with reduced pitch between C4 balls. As the pitch of a C4 array decreases, for example from a 4 on 8 array to a 3 on 6 array, the diameter of the C4 ball also decreases. Since the cross-sectional area of a C4 ball shrinks with the shrinking diameter of the C4 ball, the current carrying capacity of the C4 ball also reduces with the shrinking diameter of the C4 ball. Thus, C4 balls employed in a 3 on 6 array have reduced current carrying capacity compared to C4 balls employed in a 4 on 8 array. Such a trend is expected to continue as advanced semiconductor modules employ a large number of input and output nodes.

In general, a reduction in the size of a C4 ball requires a capability to handle a higher current density in the C4 ball. In light of such requirements, the need to enhance current handling capacity of C4 balls has become imperative.

Further, elimination of aluminum pads is desirable in some semiconductor chips. In this case, the absence of aluminum pads results in reduction in heat spreading and lateral thermal and electrical conduction as a C4 ball is bonded on a copper pad. Such a configuration requires enhancement in electromigration resistance, i.e., a higher current carrying capacity for the C4 ball.

Yet further, lead-free C4 balls, which comprise Sn, Cu, and Ag, provide enhancement in intermetallic compound formation between the C4 ball and the underbump metallurgy structure, thereby causing an increase in the amount of material consumed during the reflow of the C4 ball. Such intermetallic compounds tend to create hot spots at which a local current density is higher than the surrounding region, and electromigration failure may occur at such hot spots.

In view of the above, there exists a need for an underbump metallurgy structure that provides an enhanced current carrying capacity for a C4 ball to be bonded thereupon, and methods of manufacturing the same.

SUMMARY OF THE INVENTION

The present invention addresses the needs described above by providing an underbump metallurgy structure including a first metallic diffusion barrier layer, an elemental metal conductive layer, a second metallic diffusion barrier layer, and a wetting promotion layer, in which the elemental metal conductive layer spreads current density therein uniformly to avoid a region of a high current density in a C4 ball formed on the underbump metallurgy structure.

In the present invention, a first metallic diffusion barrier layer is formed on a last level metal plate exposed in an opening of a passivation layer. Optionally, a metallic adhesion promotion layer is formed on the first metallic diffusion barrier layer. An elemental metal conductive layer is formed on the metallic adhesion promotion layer, which provides a highly conductive structure that distributes current uniformly due to the higher electrical conductivity of the material than the layers above or below. A stack of the second metallic diffusion barrier layer and a wetting promotion layer is formed, on which a C4 ball is bonded. The elemental metal conductive layer distributes the current uniformly within the underbump metallurgy structure, which induces a more uniform current distribution in the C4 ball and enhanced electromigration resistance of the C4 ball.

According to an aspect of the present invention, a semiconductor structure is provided, which comprises:

a metal pad located on a metal interconnect structure;

a dielectric passivation layer located over a periphery of the metal pad and containing an opening over a center portion of the metal pad;

a first metallic diffusion barrier layer located on the metal pad;

an elemental metal conductive layer located on the first metallic diffusion barrier layer;

a second metallic diffusion barrier layer located on the elemental metal conductive layer; and a wetting promotion layer located on the second metallic diffusion barrier layer and comprising a material that promotes wetting of a C4 ball.

In one embodiment, the elemental metal conductive layer comprises elemental Cu.

In another embodiment, the first metallic diffusion barrier layer comprises a conductive metal nitride or TiW.

In even another embodiment, the conductive metal nitride is selected from TiN, TaN, and WN.

In yet another embodiment, the semiconductor structure further comprises a metallic adhesion promotion layer comprising an elemental metal and vertically abutting the first metallic diffusion barrier layer and the elemental metal conductive layer.

In still another embodiment, the first metallic diffusion barrier comprises a nitride of the elemental metal.

In still yet another embodiment, the semiconductor structure further comprises a metallic adhesion promotion layer comprising a Cr—Cu alloy and vertically abutting the first metallic diffusion barrier layer and the elemental metal conductive layer.

In a further embodiment, the second metallic diffusion barrier layer comprises a Cr—Cu alloy.

In an even further embodiment, the second metallic diffusion barrier layer comprises a stack of a conductive metal layer comprising an elemental metal and a conductive metal nitride layer comprising a conductive metal nitride derived from the elemental metal comprising the conductive metal layer, wherein the conductive metal layer abuts the elemental metal conductive layer and the conductive metal nitride layer abuts the wetting promotion layer. The elemental metal may be Ta, Ti, or W.

In a yet further embodiment, the wetting promotion layer is a Cu layer, a Ni layer, or a stack of a Cu layer and a Ni layer.

In a still further embodiment, the metal pad comprises Al, and the first metallic diffusion barrier layer vertically abuts the metal pad.

In a still yet further embodiment, the semiconductor structure further comprises a metallic oxidation barrier layer vertically abutting the metal pad and the first metallic diffusion barrier layer, wherein the metal pad comprises Cu.

In further another embodiment, the semiconductor structure further comprises a C4 ball that is soldered directly onto the wetting promotion layer.

According to another aspect of the present invention, a method of forming a semiconductor structure is provided, which comprises:

forming a metal pad on a metal interconnect structure;

forming a first metallic diffusion barrier layer on the metal pad;

forming an elemental metal conductive layer on the first metallic diffusion barrier layer;

forming a second metallic diffusion barrier layer on the elemental metal conductive layer; and forming a wetting promotion layer on the second metallic diffusion barrier layer, wherein the wetting promotion layer comprises a material that promotes wetting of a C4 ball.

In one embodiment, the elemental metal conductive layer comprises elemental Cu.

In another embodiment, the first metallic diffusion barrier layer comprises a conductive metal nitride or TiW.

In even another embodiment, the second metallic diffusion barrier layer comprises a Cr—Cu alloy.

In yet another embodiment, the second metallic diffusion barrier layer comprises a stack of a Ti layer and a TiN layer, and the Ti layer abuts the elemental metal conductive layer and the TiN layer abuts the wetting promotion layer.

In still another embodiment, the wetting promotion layer is a Cu layer, a Ni layer, or a stack of a Cu layer and a Ni layer.

In a further embodiment, the metal pad comprises Al, and the first metallic diffusion barrier layer vertically abuts the metal pad.

In an even further embodiment, the method further comprises a metallic oxidation barrier layer vertically abutting the metal pad and the first metallic diffusion barrier layer, wherein the metal pad comprises Cu.

In a yet further embodiment, the method further comprises:

forming a dielectric passivation layer over the metal pad; and forming an opening in the dielectric passivation layer and exposing a top surface of the metal pad.

In a still further embodiment, the method further comprises soldering a C4 ball directly onto the wetting promotion layer.

DETAILED DESCRIPTION OF THE INVENTION

Figure 1:
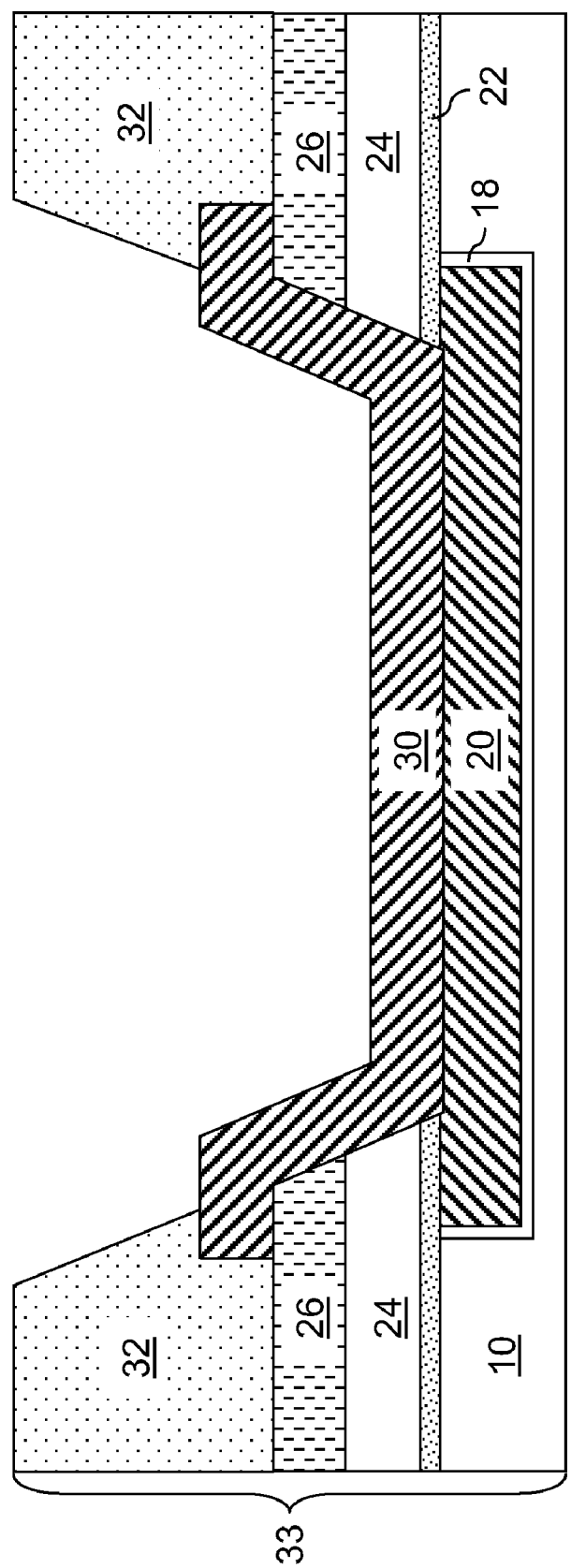
FIGS. 1 and 2 are sequential vertical cross-sectional view of a first exemplary semiconductor structure according to a first embodiment of the present invention.

As stated above, the present invention relates to under-bump metallurgy (UBM) structures including a conductive layer that provides uniform current density through a C4 ball, and methods of forming the same, which are now described in detail with accompanying figures. It is noted that like and corresponding elements are referred to by like reference numerals.

Referring to FIG. 1, a first exemplary semiconductor structure according to a first embodiment of the present invention comprises a first back-end-of-line (BEOL) interconnect structure 33, which includes a final level interconnect structure, a first dielectric layer 24, a second dielectric layer 26, a metal pad 30, and a dielectric passivation layer 32. The final level interconnect structure comprises a final level dielectric layer 10, a final level metallic barrier layer 18, a final level metal line 20, and a final level dielectric cap layer 22. Semiconductor devices (not shown) are formed on the semiconductor substrate by employing semiconductor manufacturing processes known in the art. Typically, additional BEOL interconnect structures (not shown) are present between the semiconductor devices and the first BEOL interconnect structure 33. The additional BEOL interconnect structures facilitate wiring of the semiconductor devices.

The final level dielectric layer 10 comprises a dielectric material capable of withstanding high sheer stress such as doped or undoped silicon oxide, e.g., undoped silicate glass (USG), fluorosilicate glass (FSG), organosilicate glass (OSG), a SiCOH based CVD low-k dielectric material, etc. The dielectric material of the final level dielectric layer 10 may be porous, or non-porous. The undoped silicate glass (USG) includes any undoped silicate glass such as TEOS oxide, which is an undoped silicate glass formed by employing tetra-ethyl-ortho-silicate (TEOS) as a precursor material. The fluorosilicate glass (FSG) includes any silicate glass that is doped with fluorine such as FTEOS oxide, which is a fluorosilicate glass formed by employing TEOS as a precursor material. The final level dielectric layer 10 may be formed by plasma enhanced chemical vapor deposition (PECVD), high density plasma chemical vapor deposition, etc. The thickness of the final level dielectric layer 10 may be from about 300 nm to about 3000 nm, although lesser and greater thicknesses are contemplated herein also. The final level metallic barrier layer 18 may comprise Ta, TaN, W, WN, TiN, or a stack thereof such as Ta/TaN, Ta/TaN/Ta, TaN/Ta, etc. The final level metal line 20 comprises a conductive metal, which is typically Cu. The final level metal line 20 is typically formed by sputtering of a seed layer comprising the conductive metal, electroplating of more conductive metal on the seed layer, and planarization of the electroplated conductive metal employing chemical mechanical planarization (CMP). The height of the final level metal line 20 may be from about 150 nm to about 500 nm, although lesser and greater heights are contemplated herein also. The final level dielectric cap layer 22 may comprise a dielectric material such as silicon nitride, an Si:C compound, an Si:C:N compound, or a stack thereof. An example of the Si:C compound is BloK™. An example of the Si:C:N compound is NBLoK™.

Each of the first dielectric layer 24 and the second dielectric layer 26 comprises a dielectric material such as silicon oxide or silicon nitride. At least one of the first dielectric layer 24 and the second dielectric layer 26 comprises a material that functions as a barrier layer against moisture ingress and oxygen ingress into the final level interconnect structure (10, 18, 20, 22). For example, the first dielectric layer 24 may comprise silicon oxide and the second dielectric layer 26 may comprise silicon nitride. The first dielectric layer 24 and the second dielectric layer 26 may be formed, for example, by plasma enhanced chemical vapor deposition (PECVD) or high density plasma chemical vapor deposition (HDPCVD). The thickness of the first dielectric layer 24 may be from about 200 nm to about 900 nm, and typically from about 300 nm to about 600 nm, although lesser and greater thicknesses are contemplated herein also. The thickness of the second dielectric layer 26 may be from about 200 nm to about 800 nm, and typically from about 300 nm to about 500 nm, although lesser and greater thicknesses are contemplated herein also.

An opening is formed in the first and second dielectric layers (24, 26) by lithographic methods, i.e., by applying a photoresist, patterning the photoresist to form an opening above the final level metal line 20, and transferring the pattern in the photoresist so that an opening is formed within the first and second dielectric layers (24, 26) and a top surface of the final level metal line 20 is exposed. The metal pad 30, which typically comprise Al, is formed by deposition of a metal layer followed by lithographic patterning. Typically, the metal pad 30 fills the entirety of the opening in the first and second dielectric layers (24, 26) and overlies edge portions of the top surface of the second dielectric layer 26 around the opening therein.

The metal pad 30 may have a thickness from about 0.8 μm to about 3.0 μm, and typically from about 1.0 μm to about 2.0 μm. The metal pad 30 may include a pad liner portion (not shown), which may comprise a stack of a TaN layer, a Ti layer, and a TiN layer, from bottom to top. For example, the thickness of the TaN layer may be about 70 nm, the thickness of the Ti layer may be about 25 nm, and the thickness of the TiN layer may be about 25 nm, although variations in the thicknesses of the various metallic liner layers may vary depending on application. The shape and the lateral dimension of the metal pad 30 depend on the size of a C4 ball to be subsequently soldered thereupon. The diameter of the metal pad 30, if it has a shape of circle as seen from above, may be from about 50 μm to about 100 μm, although lesser and greater diameters are contemplated herein also.

The dielectric passivation layer 32 comprises a dielectric material that provides additional passivation over the underlying dielectric layers such as the first and second dielectric layers (24, 26). The dielectric passivation layer 32 may, or may not, be photosensitive. For example, the dielectric passivation layer 32 may comprise photosensitive polyimide (PSPI). The thickness of the dielectric passivation layer 32 may be from about 2 μm to about 10 μm, and typically from about 3 μm to about 6 μm, although lesser and greater thicknesses are also contemplated herein. An opening is formed in the dielectric passivation layer 32 by lithographic methods to expose a top surface of the metal pad 30. In case the dielectric passivation layer 32 is a photosensitive material, the dielectric passivation layer 32 may be patterned by lithographic exposure and development only. In case the dielectric passivation layer 32 is a non-photosensitive material, a photoresist (not shown) is applied and lithographically patterned, and the pattern in the photoresist is transferred into the dielectric passivation layer 32 by an etch. The photoresist is subsequently removed. This process is generally followed by a final cure.

Figure 2:
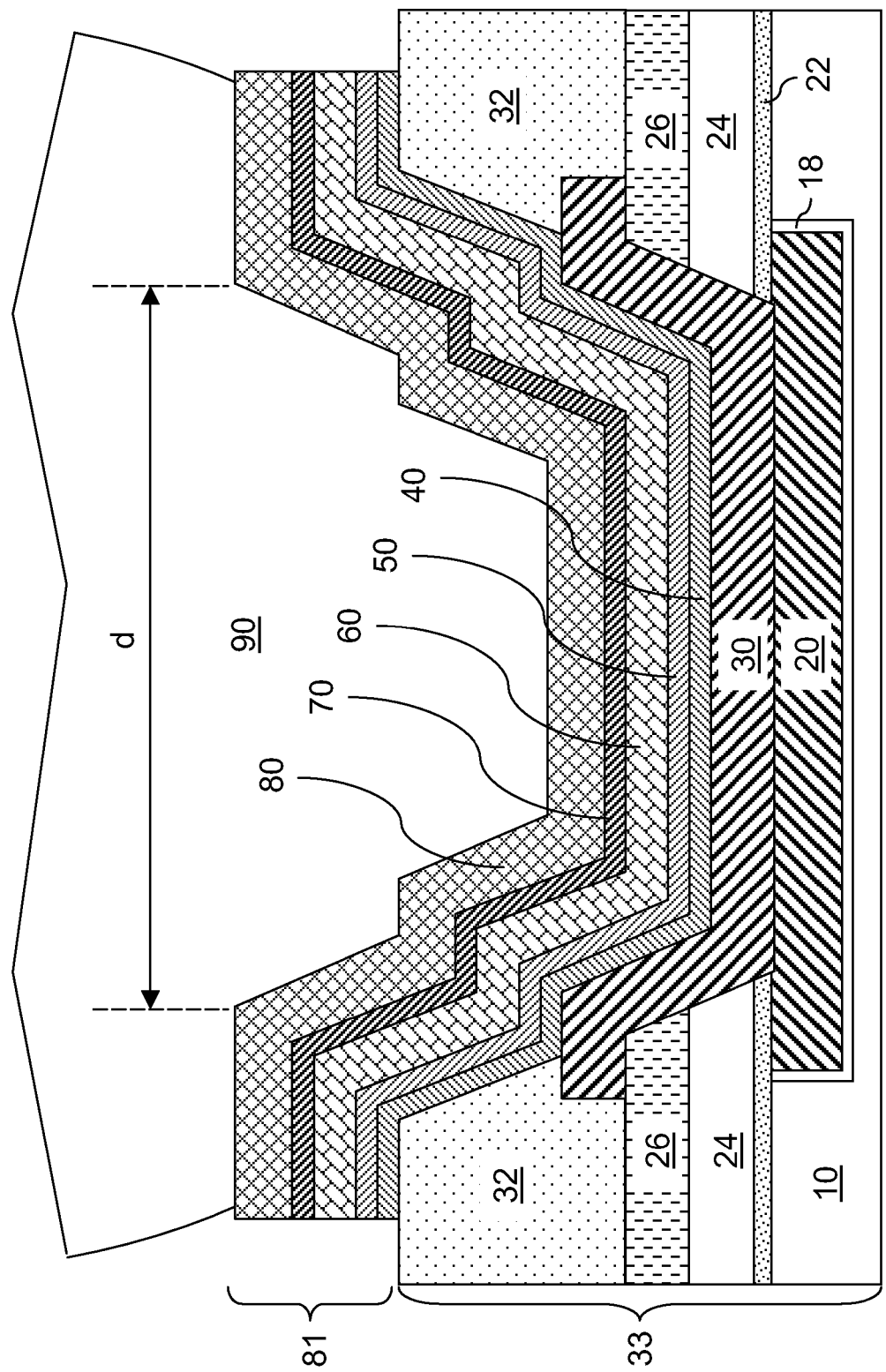

Referring to FIG. 2, a first underbump metallurgy structure 81 is formed directly on the metal pad 30 and the dielectric passivation layer 32 by deposition of a stack of conductive layers followed by lithographic patterning of the stack of the conductive layers according to a first embodiment of the present invention. The first underbump metallurgy structure 81 comprises, from bottom to top, a first metallic diffusion barrier layer 40, a metallic adhesion promotion layer 50, an elemental metal conductive layer 60, a second metallic diffusion barrier layer 70, and a wetting promotion layer 80. Each of the conductive layers in the first underbump metallurgy structure 81 is sequentially formed from bottom to top by a blanket deposition as a contiguous film covering the entirety of the underlying surfaces. A photoresist (not shown) is applied over the wetting promotion layer 80 and lithographically patterned by exposure and development. The remaining portion of the developed photoresist covers the portion of the conductive layers in the area of the metal pad 30. Employing the photoresist as an etch mask, the exposed portions of the conductive layers above the dielectric passivation layer 32 are removed. The top surface of the dielectric passivation layer 32 is uncovered outside the area of the first underbump metallurgy structure 81.

Specifically, the first metallic diffusion barrier layer 40 is formed directly on the metal pad 30 at a first stage of manufacturing of the first underbump metallurgy structure 81. The first metallic diffusion barrier layer 40 comprises TiW or a conductive metal nitride such as TaN, TiN, WN, or a combination thereof. The first metallic diffusion barrier layer 40 may be formed by chemical vapor deposition (CVD), physical vapor deposition (PVD), atomic layer deposition (ALD), etc. The thickness of the first metallic diffusion barrier layer 40 may be from about 25 nm to about 300 nm, and typically from about 50 nm to about 200 nm, although lesser and greater thicknesses are contemplated herein also.

The metallic adhesion promotion layer 50 is thereafter formed directly on the first metallic diffusion barrier layer 40. The metallic adhesion promotion layer 50 comprises a first elemental metal or a Cr—Cu alloy. The first elemental metal may be Ta, Ti, or W. The Cr—Cu alloy comprises Cr and Cu, in which the atomic concentration of Cr is from about 1% to about 99%, and typically from about 10% to about 90%. Preferably, the Cr—Cu alloy consists of Cr and Cu. The metallic adhesion promotion layer 50 may be formed by chemical vapor deposition (CVD), physical vapor deposition (PVD), atomic layer deposition (ALD), etc. The thickness of the metallic adhesion promotion layer 50 may be from about 10 nm to about 100 nm, and typically from about 25 nm to about 50 nm, although lesser and greater thicknesses are contemplated herein also.

While any combination of materials for the first metallic diffusion barrier layer 40 and the metallic adhesion promotion layer 50 may be employed to practice the present invention, some combinations are more preferable due to enhanced adhesion strength between the first metallic diffusion barrier layer 40 and the metallic adhesion promotion layer 50. Particularly preferred combinations of materials for the first metallic diffusion barrier layer 40 and the metallic adhesion promotion layer 50 include a stack of a TaN layer and a Ta layer, a stack of a TiN layer and a Ti layer, a WN layer and a W layer, and a TiW layer and a Cr—Cu alloy layer.

Next, the elemental metal conductive layer 60 is formed directly on the metallic adhesion promotion layer 50. The elemental metal conductive layer 60 comprises a second elemental metal, which may be Cu, Ag, Au, or Ni. Preferably, the elemental metal conductive layer 60 comprises Cu. The elemental metal conductive layer 60 may be formed by electroplating, electroless plating, chemical vapor deposition (CVD), physical vapor deposition (PVD), atomic layer deposition (ALD), etc. Preferably, the elemental metal conductive layer 60 is formed by electroplating or electroless plating. In case the elemental metal conductive layer 60 comprises electroplated Cu, the elemental metal conductive layer 60, due to the nature of the process employed for formation, i.e., due to the nature of the plating process, comprises O, N, C, Cl, and S. The sum of concentrations of O, N, C, Cl, and S is typically from about 1 ppm to about 200 ppm. The thickness of the elemental metal conductive layer 60 may be from about 50 nm to about 3,000 nm, and typically from about 100 nm to about 1,000 nm, although lesser and greater thicknesses are contemplated herein also.

The elemental metal conductive layer 60 has a higher electrical conductivity than the materials of the first metallic diffusion barrier layer 40 and the metallic adhesion promotion layer 50. Also, the elemental metal conductive layer 60 has a higher electrical conductivity than the material of the second metallic diffusion barrier layer 70 to be subsequently formed. Preferably, the thickness of the elemental metal conductive layer 60 is greater than the thickness of the first metallic diffusion barrier layer 40, the thickness of the metallic adhesion promotion layer 50, and the thickness of the second metallic diffusion barrier layer 70 to be subsequently formed. In summary, the elemental metal conductive layer 60 serves as a better conductor of electricity than the first metallic diffusion barrier layer 40, the thickness of the metallic adhesion promotion layer 50, and the thickness of the second metallic diffusion barrier layer 70, and functions to render the current density through the first underbump metallurgy structure 81 more uniform than any prior art underbump metallurgy structure, which does not contain such an elemental metal conductive layer. Further, the first metallic diffusion barrier layer 40 and the second metallic diffusion barrier layer 70 prevents any diffusion of material, such as Sn, Ag, Cu, or Ni into the elemental metal conductive layer 60. Due to such lack of diffusion of material into the first metallic diffusion barrier layer 40, composition of the elemental metal conductive layer 60 remains constant throughout the operation of the semiconductor chip to which the first underbump metallurgy structure 81 is attached.

The second metallic diffusion barrier layer 70 is then formed directly on the elemental metal conductive layer 60. The second metallic diffusion barrier layer 70 comprises a Cr—Cu alloy or a stack of a conductive metal layer (a lower portion of element 70; not shown separately) and a conductive metal nitride layer (an upper portion of element 70; not shown separately) comprising the conductive metal nitride derived from the same metal comprising the conductive metal layer. In case the second metallic diffusion barrier layer 70 comprises a Cr—Cu alloy, the Cr—Cu alloy comprises Cr and Cu, in which the atomic concentration of Cr is from about 1% to about 99%, and typically from about 10% to about 90%. Preferably, the Cr—Co alloy consists of Cr and Cu. In case the second metallic diffusion barrier layer 70 comprises a stack of a conductive metal layer and a conductive metal nitride layer, the conductive metal layer is formed directly on the elemental metal conductive layer 60, and the conductive metal nitride layer is formed directly on the conductive metal layer. For the purposes of employing as the second metallic diffusion barrier layer 70, non-limiting exemplary stacks of a conductive metal layer and a conductive metal nitride layer include a stack of a Ta layer and a TaN layer, a stack of a Ti layer and a TiN layer, and a stack of a W layer and a WN layer. The second metallic diffusion barrier layer 70, comprising either a Cr—Cu alloy layer or a stack of a conductive metal layer and a conductive metal nitride layer, may be formed by chemical vapor deposition (CVD), physical vapor deposition (PVD), atomic layer deposition (ALD), etc. The thickness of the second metallic diffusion barrier layer 70 may be from about 50 nm to about 400 nm, and typically from about 100 nm to about 250 nm, although lesser and greater thicknesses are contemplated herein also.

Subsequently, the wetting promotion layer 80 is formed directly on the second metallic diffusion barrier layer 70. The wetting promotion layer 80 comprises a material that promotes wetting of a C4 ball. For example, the wetting promotion layer 80 may comprise a Cu layer, a Ni layer, or a stack of a Cu layer and a Ni layer. In case the wetting promotion layer 80 comprises an exposed Ni surface, a layer of Au may optionally be added. The thickness of the layer of Au may be from about 50 nm to about 500 nm, although lesser and greater thicknesses are also contemplated herein. The wetting promotion layer 80 may be formed by electroplating, electroless plating, chemical vapor deposition (CVD), physical vapor deposition (PVD), atomic layer deposition (ALD), etc. Preferably, the wetting promotion layer 80 is formed by electroplating, electroless plating, or physical vapor deposition, i.e., sputtering. In case the wetting promotion layer 80 comprises electroplated Cu, the wetting promotion layer 80, due to the nature of the plating process, comprises O, N, C, Cl, and S. The sum of concentrations of O, N, C, Cl, and S is typically from about 1 ppm to about 200 ppm. The thickness of the wetting promotion layer 80 may be from about from about 0.7 μm to about 3 μm, and typically from about 1 μm to about 2 μm, although lesser and greater thicknesses are contemplated herein also.

The stack of the first metallic diffusion barrier layer 40, the metallic adhesion promotion layer 50, the elemental metal conductive layer 60, the second metallic diffusion barrier layer 70, and the wetting promotion layer 80 is then lithographically patterned, for example, by applying, exposing, and developing a photoresist (not shown) to form a pattern that covers a C4 pad area above and around the metal pad 30, followed by an etch that patterns the stack to form the first underbump metallurgy structure 81, which is a C4 pad. The photoresist is then removed.

A C4 ball 90, of which a portion is shown in FIG. 2, is thereafter applied to the first underbump metallurgy structure 81. The C4 ball 90 directly contacts a top surface of the wetting promotion layer 80. The C4 ball may, or may not, directly contact a portion of the passivation layer 32 along the periphery of the first underbump metallurgy structure 81.

The C4 ball 90 may comprise a lead-based solder. Alternately and preferably, the C4 ball 90 may comprise a lead-free solder. In this case, the C4 ball may comprise a Sn—Cu alloy, a Sn—Ag alloy, or a Sn—Cu—Ag alloy. In case Cu is present, the concentration of Cu is about 0.7 atomic percent. In case Ag is present, the concentration of Ag is from about 0.5 atomic percent to about 3.5 atomic percent. The diameter of the C4 ball 90, as measured in the largest horizontal cross-section of the C4 ball 90, may be from about 50 μm to about 120 μm, although lesser and greater diameters of the C4 ball are also contemplated herein. The diameter of the C4 ball 90 is greater than an opening diameter d of the wetting promotion layer 80, which is the diameter of the outer periphery of the recessed portion of the wetting promotion layer 80.

The C4 ball 90 is then "reflowed" to enhance adhesion to the wetting promotion layer 80. The reflow of the C4 ball 90 is facilitated by subjecting the C4 ball 90 and the first underbump metallurgy structure to an anneal at an elevated temperature from about 210° C. to about 260° C., and typically from about 220° C. to about 250° C. The duration of the anneal at the elevated temperature may be from about 1 hour to about 24 hours, and typically from 2 hours to about 12 hours. During the reflow, a portion of the wetting promotion layer 80 reacts with the material of the C4 ball 90, which is the Sn—Cu alloy, the Sn—Ag alloy, or the Sn—Cu—Ag alloy. Cu atoms and/or Ni atoms in a top portion of the wetting promotion layer 80 diffuse into the C4 ball 90 to form a Cu and/or Ni diffused solder region (not shown) within the C4 ball 90. In other words, a portion of the C4 ball 90 that adjoins the wetting promotion layer 80 reacts with solder to form the Cu and/or Ni diffused solder region, which comprises a Cu—Sn alloy, a Ni—Sn alloy, a Cu—Ni—Sn alloy, a Cu—Ag alloy, a Ni—Ag alloy, a Cu—Ni—Ag alloy, a Cu—Sn—Ag alloy, a Ni—Sn—Ag alloy, or a Ni—Cu—Sn—Ag alloy. The rest of the C4 ball 90 has the same composition as the C4 ball 90 prior to the reflow. Depending on the composition of the C4 ball 90, a higher reflow temperature may be employed.

Despite the formation of the various possible alloys between the wetting promotion layer 80 and the C4 ball 90, such an alloy is not formed in the elemental metal conductive layer 60 since the second metallic diffusion barrier layer 70 prevents any diffusion of material from the C4 ball 90 or the wetting promotion layer 80. Thus, the elemental metal conductive layer 60 comprises elemental metal, e.g., Cu, and continues to provide a high conductivity structure throughout the lifetime of the semiconductor module containing the first underbump metallurgy structure 81. The high electrical conductivity provided by the elemental metal conductive layer 60 spreads the electrical current through the first underbump metallurgy structure 81 uniformly so that the current density becomes more uniform within the C4 ball 90 and hot spots having a higher current density, elevated local temperature, and enhanced electromigration are avoided within the C4 ball 90. The combination of such factors have the beneficial effect of enhancing electromigration resistance of the C4 ball 90 and thereby suppressing electromigration failures within the C4 ball 90.

Figure 3:
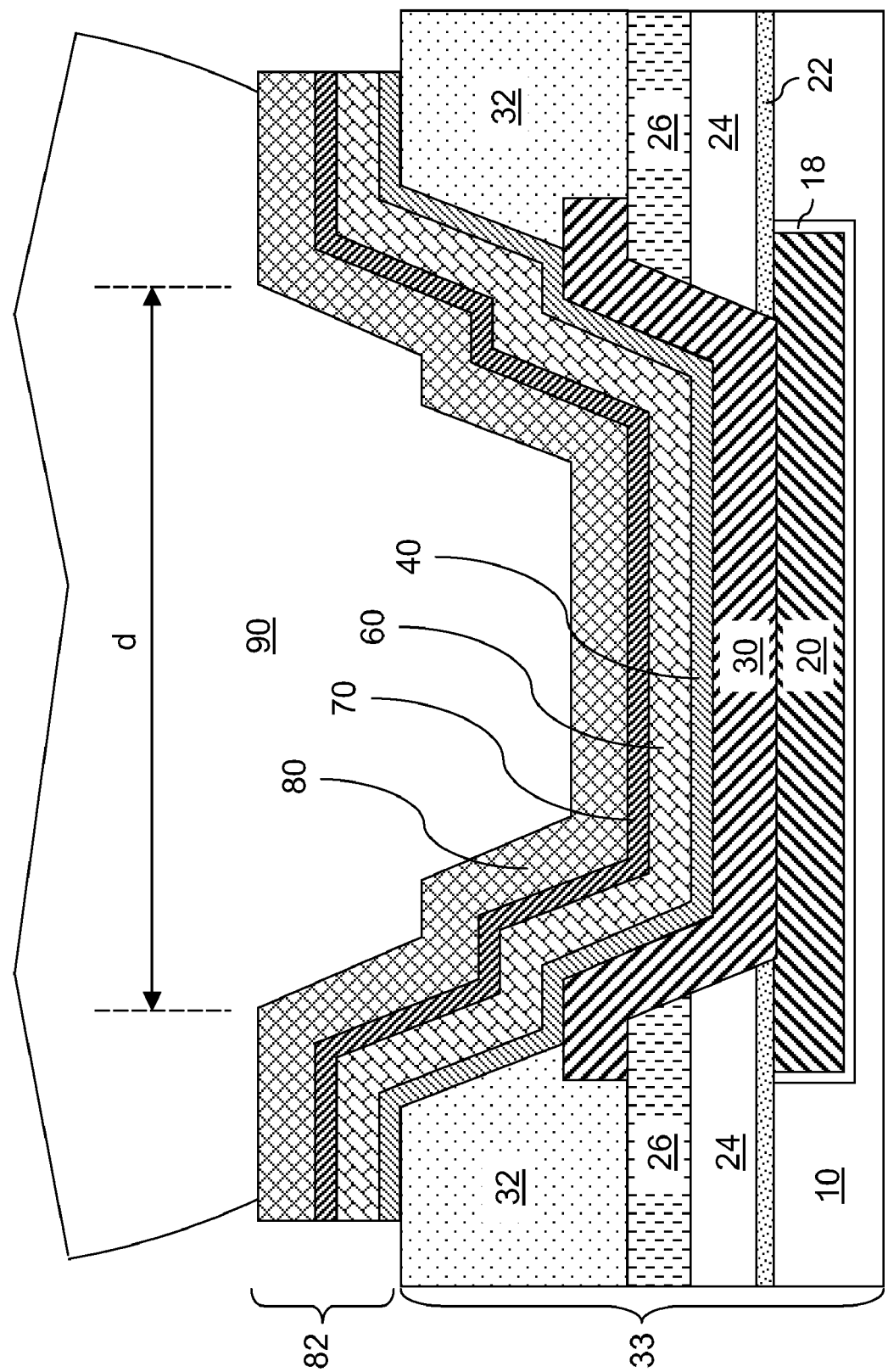
"FIG. 3 is a vertical cross-sectional view of a secondary exemplary semiconductor structure according to a second embodiment of the present invention."

Referring to FIG. 3, a second exemplary semiconductor structure according to a second embodiment of the present invention comprises a second underbump metallurgy structure 82 formed directly on the first back-end-of-line (BEOL) interconnect structure 33. The second underbump metallurgy structure 82 comprises, from bottom to top, a first metallic diffusion barrier layer 40, an elemental metal conductive layer 60, a second metallic diffusion barrier layer 70, and a wetting promotion layer 80. In other words, the second underbump metallurgy structure 82 is formed by omitting the metallic adhesion promotion layer 50 of the first underbump metallurgy structure 81 of the first embodiment.

Each of the conductive layers in the second underbump metallurgy structure 82 is sequentially formed from bottom to top by a blanket deposition as a contiguous film covering the entirety of the underlying surfaces. After forming the wetting promotion layer 80, lithographic processing steps and an etch step are performed in the same manner as in the first embodiment. While all other processing steps are identical to the processing steps of the first embodiment, the processing step employed to form the adhesion promotion layer 50 is omitted in the second embodiment. Thus, the elemental metal conductive layer 60 is formed directly on the first metallic diffusion barrier layer 40. The composition and thickness of each of the first metallic diffusion barrier layer 40, the elemental metal conductive layer 60, the second metallic diffusion barrier layer 70, and the wetting promotion layer 80 are the same as in the first embodiment.

After lithographically patterning the stack of the first metallic diffusion barrier layer 40, the elemental metal conductive layer 60, the second metallic diffusion barrier layer 70, and the wetting promotion layer 80 to form the second underbump metallurgy structure 82, which is a C4 pad, a C4 ball 90, of which a portion is shown in FIG. 3, is applied to the second underbump metallurgy structure 81. The composition and the size of the C4 ball 90 is the same as in the first embodiment. The C4 ball 90 is then reflowed as in the first embodiment to form a Cu and/or Ni diffused solder region as in the first embodiment.

Despite the formation of the various possible alloys between the wetting promotion layer 80 and the C4 ball 90, such an alloy is not formed in the elemental metal conductive layer 60 since the second metallic diffusion barrier layer 70 prevents any diffusion of material from the C4 ball 90 or the wetting promotion layer 80 in the same manner as in the first embodiment. Thus, electromigration resistance of the C4 ball 90 is enhanced and electromigration failures within the C4 ball 90 as in the first embodiment.

Figure 4:
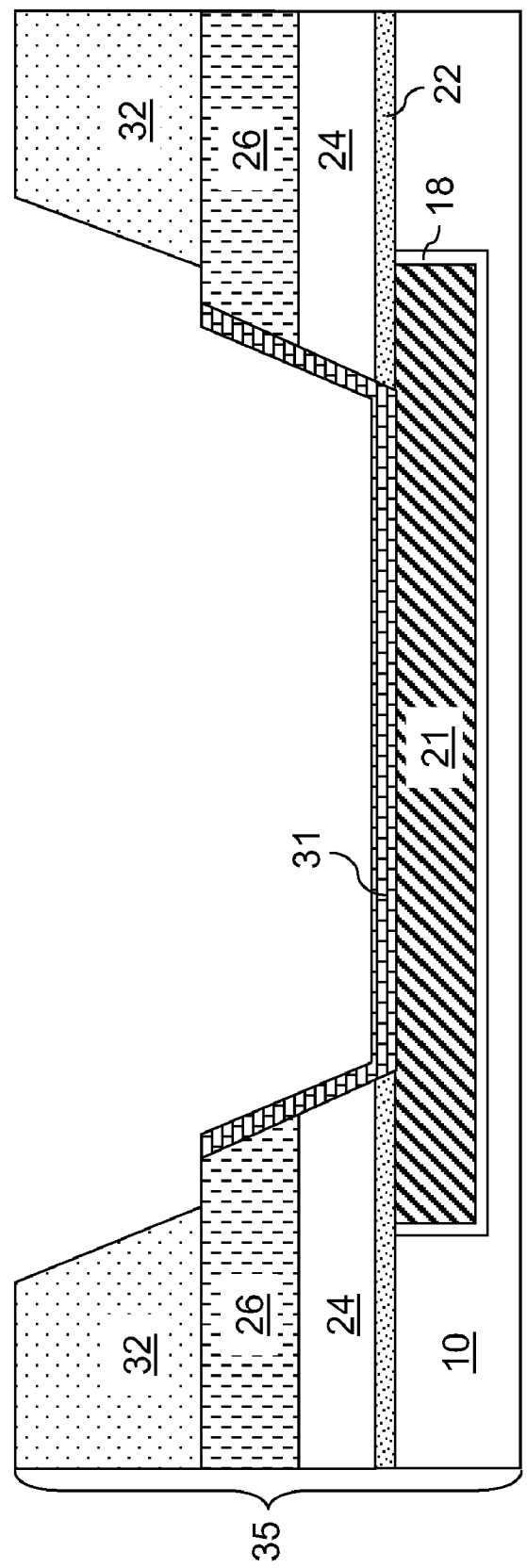
FIGS. 4 and 5 are sequential vertical cross-sectional view of a third exemplary semiconductor structure according to a third embodiment of the present invention.

Referring to FIG. 4, a third exemplary semiconductor structure according to a third embodiment of the present invention comprises a second back-end-of-line (BEOL) interconnect structure 35, which includes a final level interconnect structure, a first dielectric layer 24, a second dielectric layer 26, a metallic oxidation barrier layer 31, and a dielectric passivation layer 32. The final level interconnect structure comprises a final level dielectric layer 10, a final level metallic barrier layer 18, a metal pad 21, and a final level dielectric cap layer 22. Semiconductor devices (not shown) are formed on the semiconductor substrate by employing semiconductor manufacturing processes known in the art. Typically, additional BEOL interconnect structures (not shown) are present between the semiconductor devices and the second BEOL interconnect structure 35. The additional BEOL interconnect structures facilitate wiring of the semiconductor devices.

The composition and thickness of the final level dielectric layer 10 and the final level metallic barrier layer 18 are substantially the same as in the first and second embodiments. The metal pad 21 comprises a conductive metal, which is typically Cu. The metal pad 21 may be formed with final level metal lines (not shown) that are embedded in the final level dielectric layer 10. The metal pad 21 may be formed by the same processing steps employed to form the final level metal lines 20 in the first embodiment. The lateral dimensions of the metal pad 21 are selected to enable subsequent accommodation of a C4 ball. The vertical dimensions of the metal pad 21 may be substantially the same as the vertical dimensions of the final level metal lines 20 in the first embodiment, i.e., the height of the metal pad 21 may be from about 150 nm to about 500 nm, although lesser and greater heights are contemplated herein also. The final level dielectric cap layer 22 may comprise a dielectric material such as silicon nitride, an Si:C compound, an Si:C:N compound, or a stack thereof.

The composition and thickness of each of the first and second dielectric layers (24, 26) are substantially the same as in the first and second embodiments. An opening is formed in the first and second dielectric layers (24, 26) by lithographic methods, i.e., by applying a photoresist, patterning the photoresist to form an opening above the metal pad 21, and transferring the pattern in the photoresist so that an opening is formed within the first and second dielectric layers (24, 26) and a top surface of the metal pad 21 is exposed. The metallic oxidation barrier layer 31, which typically comprise TaN, is formed by deposition of a blanket metal layer followed by lithographic patterning. The thickness of the metallic oxidation barrier layer 31 may be from about 30 nm to about 200 nm, and typically from about 50 nm to about 150 nm. Typically, the metallic oxidation barrier layer 31 fills the entirety of the opening in the first and second dielectric layers (24, 26). The metallic oxidation barrier layer 31 protects the metal pad 21 from oxidation by exposure to an oxygen-containing ambient. The diameter of the metallic oxidation barrier layer 31, if it has a shape of circle as seen from above, may be from about 50 μm to about 100 μm, although lesser and greater diameters are contemplated herein also.

The composition and thickness of the dielectric passivation layer 32 are substantially the same as in the first embodiment. An opening is formed in the dielectric passivation layer 32 by lithographic methods to expose a top surface of the metallic oxidation barrier layer 31.

Figure 5:
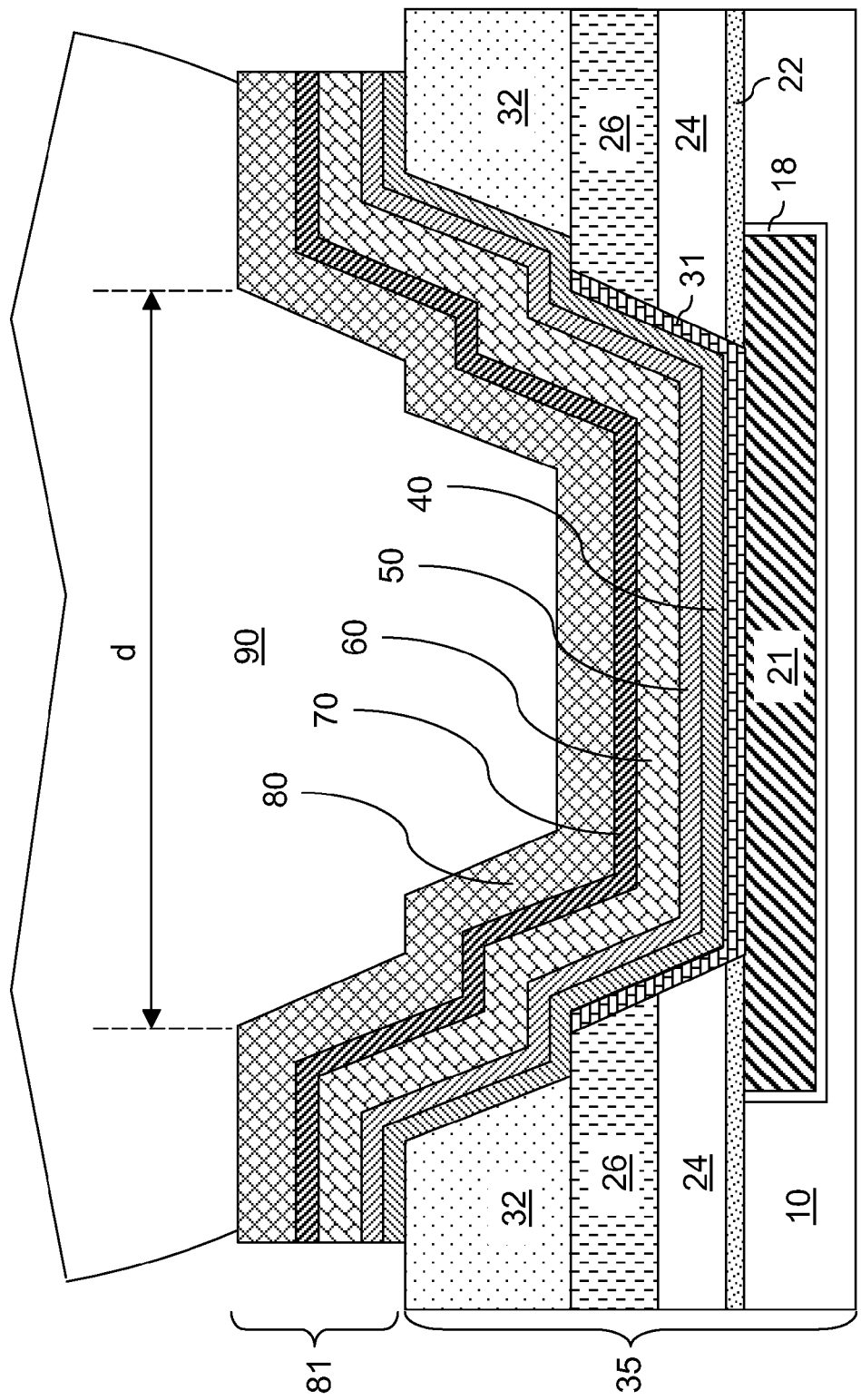

Referring to FIG. 5, a first underbump metallurgy structure 81, which structurally identical to the first underbump metallurgy structure 81 of the first embodiment, is formed directly on the second back-end-of-line (BEOL) interconnect structure 35. A C4 ball 90, having the same composition and structure as in the first and second embodiments, is soldered on the first underbump metallurgy structure 81, and reflowed as in the first and second embodiments.

Since the second metallic diffusion barrier layer 70 prevent any diffusion of material from the C4 ball 90 or the wetting promotion layer 80 in the same manner as in the first embodiment, no intermetallic compound is formed in the elemental metal conductive layer 60, which induces uniform distribution of current within the C4 ball 90. Thus, electromigration resistance of the C4 ball 90 is enhanced and electromigration failures within the C4 ball 90 as in the first embodiment.

Figure 6:
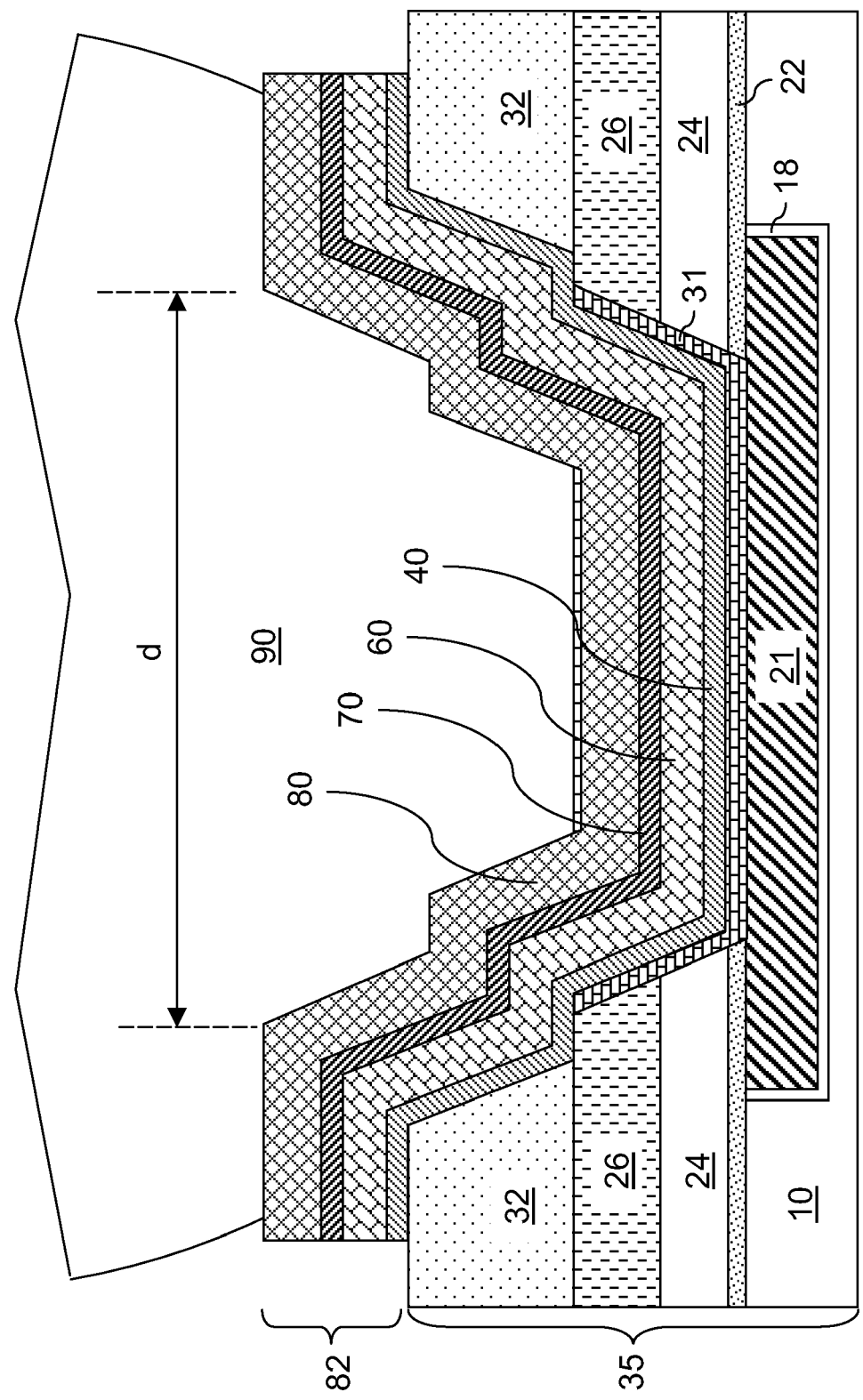
FIG. 6 is a vertical cross-sectional view of a fourth exemplary semiconductor structure according to a fourth embodiment of the present invention.

Referring to FIG. 6, a fourth exemplary semiconductor structure according to a fourth embodiment of the present invention comprises a second underbump metallurgy structure 82 formed directly on a second back-end-of-line (BEOL) interconnect structure 35. The second underbump metallurgy structure 82 is substantially the same as, and may be formed by employing the same processing steps as, in the second embodiment. The second back-end-of-line (BEOL) interconnect structure 35 is substantially the same as, and may be formed by employing the same processing steps as, in the third embodiment. A C4 ball 90, having the same composition and structure as in the first through third embodiments, is soldered on the second underbump metallurgy structure 82, and reflowed as in the first through third embodiments.

Since the second metallic diffusion barrier layer 70 prevent any diffusion of material from the C4 ball 90 or the wetting promotion layer 80 in the same manner as in the first embodiment, no intermetallic compound is formed in the elemental metal conductive layer 60, which induces uniform distribution of current within the C4 ball 90. Thus, electromigration resistance of the C4 ball 90 is enhanced and electromigration failures within the C4 ball 90 as in the first embodiment.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a metal pad located on a metal interconnect structure;
   a dielectric passivation layer located over a periphery of said metal pad and containing an opening over a center portion of said metal pad;
   a first metallic diffusion barrier layer located on said metal pad;
   an elemental metal conductive layer comprising elemental Cu, elemental Au, elemental Ag, or elemental Ni and located on said first metallic diffusion barrier layer;
   a second metallic diffusion barrier layer located on said elemental metal conductive layer, wherein said second metallic diffusion barrier layer is a stack of a conductive metal layer and a conductive metal nitride layer, said conductive metal layer comprises an elemental metal and said conductive metal nitride layer comprises a conductive metal nitride derived from said elemental metal, and wherein said second metallic diffusion barrier layer and said first metallic diffusion barrier layer comprise different materials; and
   a wetting promotion layer located on said second metallic diffusion barrier layer and comprising a material that promotes wetting of a C4 ball, wherein said conductive metal layer of said second metallic diffusion barrier layer abuts said elemental metal conductive layer and said conductive metal nitride layer abuts said wetting promotion layer.

2. The semiconductor structure of claim 1, wherein said elemental metal conductive layer comprises elemental Cu, elemental Au, or elemental Ag.

3. The semiconductor structure of claim 1, wherein said first metallic diffusion barrier layer comprises TiN, TaN, WN, or TiW.

4. The semiconductor structure of claim 3, wherein said first metallic diffusion barrier layer comprises a material selected from TiN, TaN, and WN.

5. The semiconductor structure of claim 3, further comprising a metallic adhesion promotion layer comprising an elemental metal and vertically abutting said first metallic diffusion barrier layer and said elemental metal conductive layer.

6. The semiconductor structure of claim 5, wherein said first metallic diffusion barrier comprises a nitride of said elemental metal.

7. The semiconductor structure of claim 3, further comprising a metallic adhesion promotion layer comprising a Cr—Cu alloy and vertically abutting said first metallic diffusion barrier layer and said elemental metal conductive layer.

8. The semiconductor structure of claim 1, wherein said wetting promotion layer is a Cu layer, a Ni layer, or a stack of a Cu layer and a Ni layer.

9. The semiconductor structure of claim 1, wherein said metal pad comprises Al, and wherein said first metallic diffusion barrier layer vertically abuts said metal pad.

10. A semiconductor structure comprising:
    a metal pad located on a metal interconnect structure;
    a dielectric passivation layer located over a periphery of said metal pad and containing an opening over a center portion of said metal pad;
    a first metallic diffusion barrier layer located on said metal pad;
    a metallic oxidation barrier layer vertically abutting said metal pad and said first metallic diffusion barrier layer, wherein said metal pad comprises Cu;
    an elemental metal conductive layer comprising elemental Cu, elemental Au, elemental Ag, or elemental Ni and located on said first metallic diffusion barrier layer;
    a second metallic diffusion barrier layer located on said elemental metal conductive layer, wherein said second metallic diffusion barrier layer is selected from a Cr—Cu alloy or a stack of a conductive metal layer and a conductive metal nitride layer, said conductive metal layer comprises an elemental metal and said conductive metal nitride layer comprises a conductive metal nitride derived from said elemental metal, wherein said second metallic diffusion barrier layer and said first metallic diffusion barrier layer comprise different materials; and
    a wetting promotion layer located on said second metallic diffusion barrier layer and comprising a material that promotes wetting of a C4 ball.

11. The semiconductor structure of claim 1, further comprising a C4 ball that is soldered directly onto said wetting promotion layer.

12. A method of forming a semiconductor structure comprising:
    forming a metal pad on a metal interconnect structure;
    forming a first metallic diffusion barrier layer on said metal pad;
    forming an elemental metal conductive layer comprising elemental Cu, elemental Au, elemental Ag, or elemental Ni on said first metallic diffusion barrier layer;
    forming a second metallic diffusion barrier layer on said elemental metal conductive layer, wherein said second metallic diffusion barrier layer is a stack of a conductive metal layer and a conductive metal nitride layer, said conductive metal layer comprises an elemental metal and said conductive metal nitride layer comprises a conductive metal nitride derived from said elemental metal, and wherein said second metallic diffusion barrier layer and said first metallic diffusion barrier layer comprise different materials; and
    forming a wetting promotion layer on said second metallic diffusion barrier layer, wherein said wetting promotion layer comprises a material that promotes wetting of a C4 ball, wherein said conductive metal layer abuts said elemental metal conductive layer and said conductive metal nitride layer of said second metallic diffusion barrier layer abuts said wetting promotion layer.

13. The method of claim 12, wherein said elemental metal conductive layer comprises elemental Cu, elemental Au, or elemental Ag.

14. The method of claim 12, wherein said first metallic diffusion barrier layer comprises TiN, TaN, WN, or TiW.

15. The method of claim 12, wherein said wetting promotion layer is a Cu layer, a Ni layer, or a stack of a Cu layer and a Ni layer.

16. The method of claim 12, further comprising soldering a C4 ball directly onto said wetting promotion layer.

* * * * *